(12) United States Patent
Xu et al.

(10) Patent No.: US 9,559,017 B2
(45) Date of Patent: Jan. 31, 2017

(54) METHOD OF FORMING SHALLOW TRENCH ISOLATIONS FOR A SEMICONDUCTOR DEVICE

(71) Applicant: Semiconductor Manufacturing International (Shanghai) Corporation, Shanghai (CN)

(72) Inventors: Kuan Xu, Shanghai (CN); Wujia Chen, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/819,508

(22) Filed: Aug. 6, 2015

(65) Prior Publication Data

US 2016/0064290 A1 Mar. 3, 2016

(30) Foreign Application Priority Data

Aug. 28, 2014 (CN) .......................... 2014 1 0432231

(51) Int. Cl.
| | | |
|---|---|---|
| *H01L 21/02* | (2006.01) | |
| *H01L 21/308* | (2006.01) | |
| *H01L 21/762* | (2006.01) | |
| *H01L 27/092* | (2006.01) | |
| *H01L 29/06* | (2006.01) | |

(Continued)

(52) U.S. Cl.
CPC ... *H01L 21/823878* (2013.01); *H01L 21/0214* (2013.01); *H01L 21/0217* (2013.01); *H01L 21/02164* (2013.01); *H01L 21/02247* (2013.01); *H01L 21/02255* (2013.01); *H01L 21/02323* (2013.01); *H01L 21/02332* (2013.01); *H01L 21/3081* (2013.01); *H01L 21/31051* (2013.01); *H01L 21/31111* (2013.01); *H01L 21/76224* (2013.01); *H01L 21/823807* (2013.01); *H01L 27/092* (2013.01); *H01L 29/7846* (2013.01)

(58) Field of Classification Search
CPC .................. H01L 21/02323; H01L 21/02326; H01L 21/02329; H01L 21/02332; H01L 29/7846; H01L 29/0649; H01L 27/0649
See application file for complete search history.

(56) References Cited

U.S. PATENT DOCUMENTS

| | | | | |
|---|---|---|---|---|
| 2006/0160322 A1* | 7/2006 | Buehrer | ............ | H01L 21/76224 438/424 |
| 2012/0157804 A1* | 6/2012 | Rogers | ................ | A61B 5/0422 600/345 |

(Continued)

*Primary Examiner* — Kevin Parendo
(74) *Attorney, Agent, or Firm* — Anova Law Group, PLLC

(57) ABSTRACT

A method for forming a semiconductor structure is provided. The method includes providing a substrate having a first region and a second region; and forming at least one first trench in the first region of the substrate, and at least one second trench in second region of the substrate. The method also includes forming a first liner layer on side and bottom surfaces of the first trench, and the side and bottom surfaces of the second trench; and performing a rapid thermal oxy-nitridation process on the first liner layer to release a tensile stress between the first liner layer and the substrate. Further, the method includes removing a portion of the first liner layer in the first region to expose the first trench; and forming a second liner layer on the side and bottom surface of the first trench.

14 Claims, 5 Drawing Sheets

(51) Int. Cl.
*H01L 21/8238* (2006.01)
*H01L 21/3105* (2006.01)
*H01L 21/311* (2006.01)
*H01L 29/78* (2006.01)

(56) References Cited

U.S. PATENT DOCUMENTS

2015/0144998 A1* 5/2015 Ching .................. H01L 29/785
  257/190
2015/0200300 A1* 7/2015 Ching ............... H01L 21/02238
  257/397

* cited by examiner

METHOD OF FORMING SHALLOW TRENCH ISOLATIONS FOR A SEMICONDUCTOR DEVICE

CROSS-REFERENCES TO RELATED APPLICATIONS

This application claims the priority of Chinese patent application No. 201410432231.X, filed on Aug. 28, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

Shallow trench isolation (STI) structures are commonly used to isolate active regions of semiconductor devices. FIGS. 1-3 illustrates an existing fabrication process of a STI structure.

As shown in FIG. 1, the process includes providing a substrate 100; and forming a trench 101 in the substrate 100. Further, as shown in FIG. 2, the process includes forming an isolation film 102 on surface of the substrate 100; and fills the trench 101. Further, as shown in FIG. 3, the process also includes polishing the isolation film 102 until the surface of the substrate 100 is exposed. Thus, a STI structure 103 is formed in the trench 101.

With the continuous development of semiconductor technology, the critical dimension (CD) of the semiconductor devices has become smaller and smaller; and the integration level of the semiconductor devices have been consciously increased. Thus, the size of STI structures is correspondingly reduced. The size reduction of the STI structures has cause the height-to-width aspect ratio of the STI structure to be continuously increased; and it is easy to form voids inside the isolation film 102 formed in the trench 101. The voids may significantly affect the isolation properties of the isolation structure 103.

In order to improve the quality of the isolation layer 102, a high aspect ratio process (HARP) is used to form the isolation layer 102. The isolation layer 102 formed by the HARP is able to match the requirement for a high respect ratio. Further, the voids in the isolation layer 102 formed by the HARP may be reduced, or avoided.

However, such STI structures formed by the HARP may have certain detrimental effects to the semiconductor devices subsequently formed on, and/or in the substrate 100. Thus, the performance of the semiconductor devices may be reduced. The disclosed device structures and methods are directed to solve one or more problems set forth above and other problems.

BRIEF SUMMARY OF THE DISCLOSURE

One aspect of the present disclosure includes a method for fabricating a semiconductor structure having a plurality of shallow trench isolation structures. The method includes providing a substrate having a first region and a second region; and forming at least one first trench in the first region of the substrate, and at least one second trench in second region of the substrate. The method also includes forming a first liner layer on side and bottom surfaces of the first trench, and the side and bottom surfaces of the second trench; and performing a rapid thermal oxy-nitridation process on the first liner layer to release a tensile stress between the first liner layer and the substrate. Further, the method includes removing a portion of the first liner layer in the first region to expose the first trench; and forming a second liner layer on the side and bottom surfaced of the first trench, the second liner layer being made of a material different than that of the first liner layer and tensile stress between the second liner layer and the substrate being more than that between the first liner layer and the substrate.

Another aspect of the present disclosure includes a semiconductor structure having a plurality of shallow trench isolation structures. The semiconductor structure includes a substrate having a first region and a second region. The semiconductor structure also includes at least one shallow trench isolation structure formed in the first region of the substrate; and at least one shallow trench isolation structure formed in the second region of the substrate. Further, the semiconductor structure includes a first liner layer treated by a rapid thermal oxy-nitridation process to release a tensile stress between the first liner layer and the substrate formed between the substrate and the shallow trench isolation structure in the second region; and a second liner layer formed between the shallow trench isolation structure and substrate in the first region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
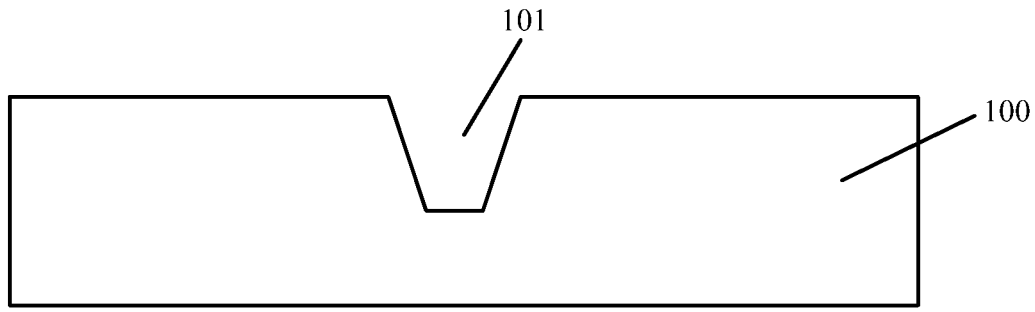
FIGS. 1-3 illustrate structures corresponding to certain stages of an existing fabrication process of a shallow trench isolation structure.
Figure 2:
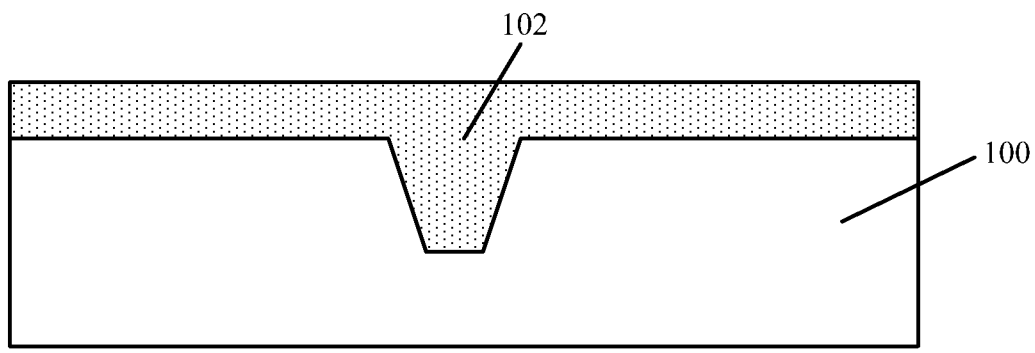
Figure 3:
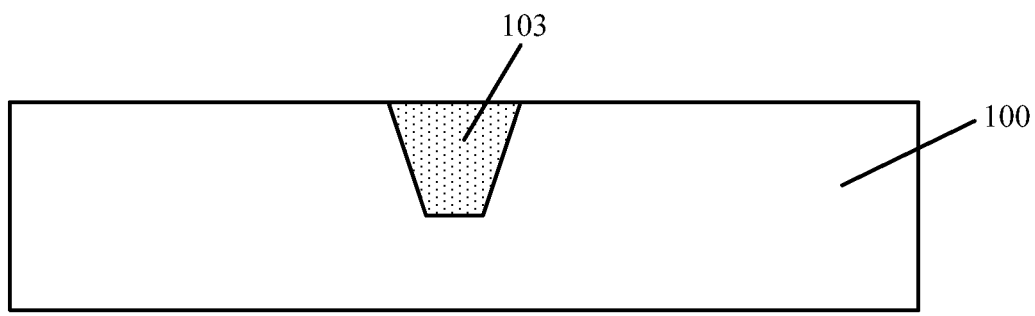

As described previously, the shallow trench isolation (STI) structures formed by a HARP may detrimentally affect the performance of the subsequently formed semiconductor devices. Referring to FIG. 3, the STI structure 103 may be made of silicon oxide; and the substrate 100 may be made of single crystalline silicon. Thus, a crystal lattice mismatch may be generated at the interface of the isolation film 102 formed by the HARP and the substrate 100.

The crystal lattice constant of silicon oxide may be smaller than the crystal lattice constant of silicon. Thus, the STI structure 103 may generate a tensile stress to the substrate 100. The tensile stress may be able to increase the carrier mobility of the channel region of the NMOS transistors. However, the tensile stress may decrease the carrier mobility of the channel region of the PMOS transistors.

Figure 4:
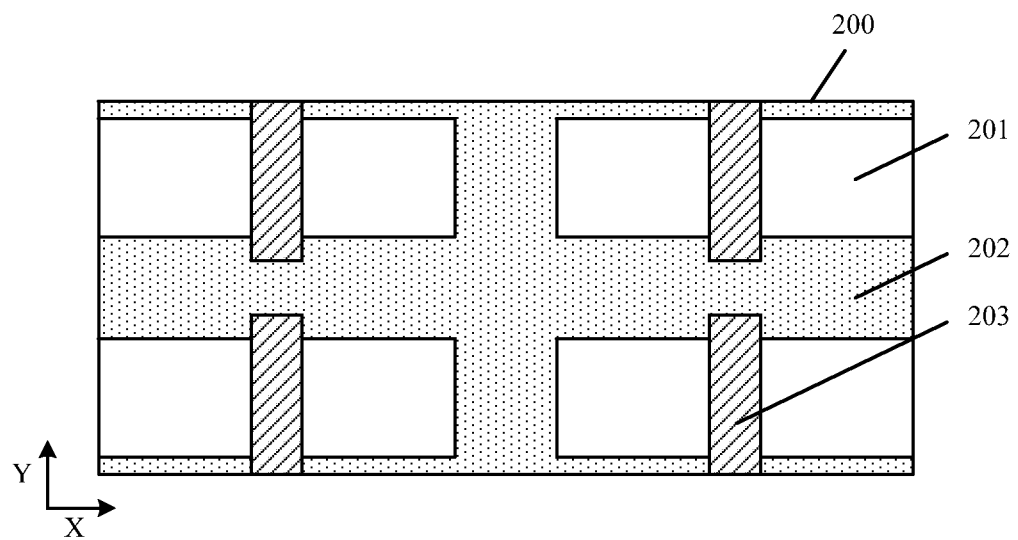
FIG. 4 illustrates a top view of shallow trench isolation structures, and active regions formed in a substrate; and gate structures formed on the surface of the substrate.

FIG. 4 illustrates a top view of a semiconductor structure having STI structures and active regions formed in a substrate; and gate structures formed on the substrate. As shown in FIG. 4, the semiconductor structure includes a substrate 200 and a plurality of the active regions 201 formed in the substrate 200. The active regions 201 may be distributed as a matrix. The semiconductor structure also includes STI structures 202 disposed between adjacent active regions 201. The STI structures 202 may isolate the active regions 201 along the "X" direction, and the "Y" direction. Further, the semiconductor structure includes a gate structure 203 formed on each of the active regions 201. The gate structure 203 may be parallel to the "Y" direction. The carriers may move in the channel regions under the gate structures 203 along the "X" direction.

The STI structures 202 parallel to the "Y" direction may generate a tensile stress along the "X" direction to the active regions 201. The direction of the tensile stress may be identical to the moving direction of the carriers. When the gate structures 203 are used for forming NMOS transistors, the tensile stress may increase the carrier mobility of the channel regions. Thus, the performance of the NMOS transistors may be improved. However, when the gate structures 203 are used for forming PMOS transistors, the tensile stress may decrease the carrier mobility of the channel regions. Thus, the performance of the PMOS transistors may be reduced.

In one embodiment, in order to release the tensile stress on the substrate caused by the STI structures, nitrogen-doped silicon oxide liner layers may be formed between the STI structures and the substrate. The N-doped silicon oxide liner layers may be disposed in the interface between the STI structures and the substrate. Thus, the N-doped silicon oxide liner layers may be able to release the crystal lattice mismatch between the STI structures and the substrate. Correspondingly, the tensile stress on the substrate applied by the STI structures may be released.

The tensile stress on the substrate caused by the STI structures may be released by forming the N-doped liner silicon oxide layer. Thus, the performance of the PMOS transistors may be improved. However, for the NMOS transistors, the loss of the tensile stress applied on the substrate may reduce the carrier mobility of the channel regions. Thus, the performance of the NMOS transistors may not be improved. According to the disclosed device structures and methods, the performance of both the NMOS transistors and the PMOS transistors (or the devices in different active regions) may be improved simultaneously by forming different types of liner layers in different regions.

Figure 12:
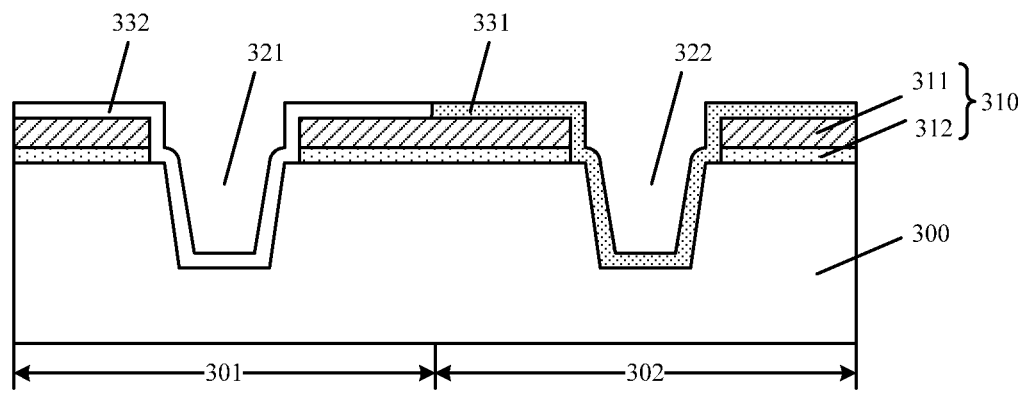
Figure 13:
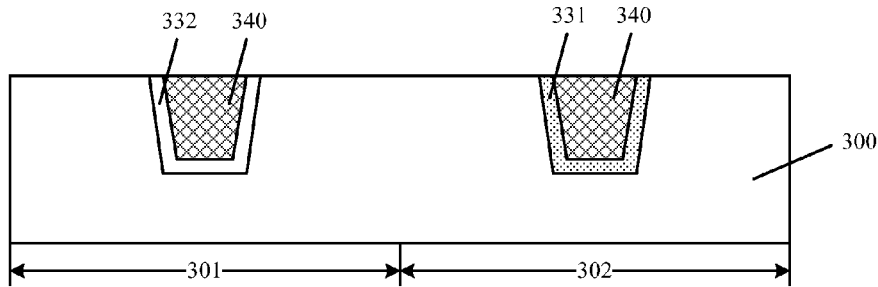
Figure 14:
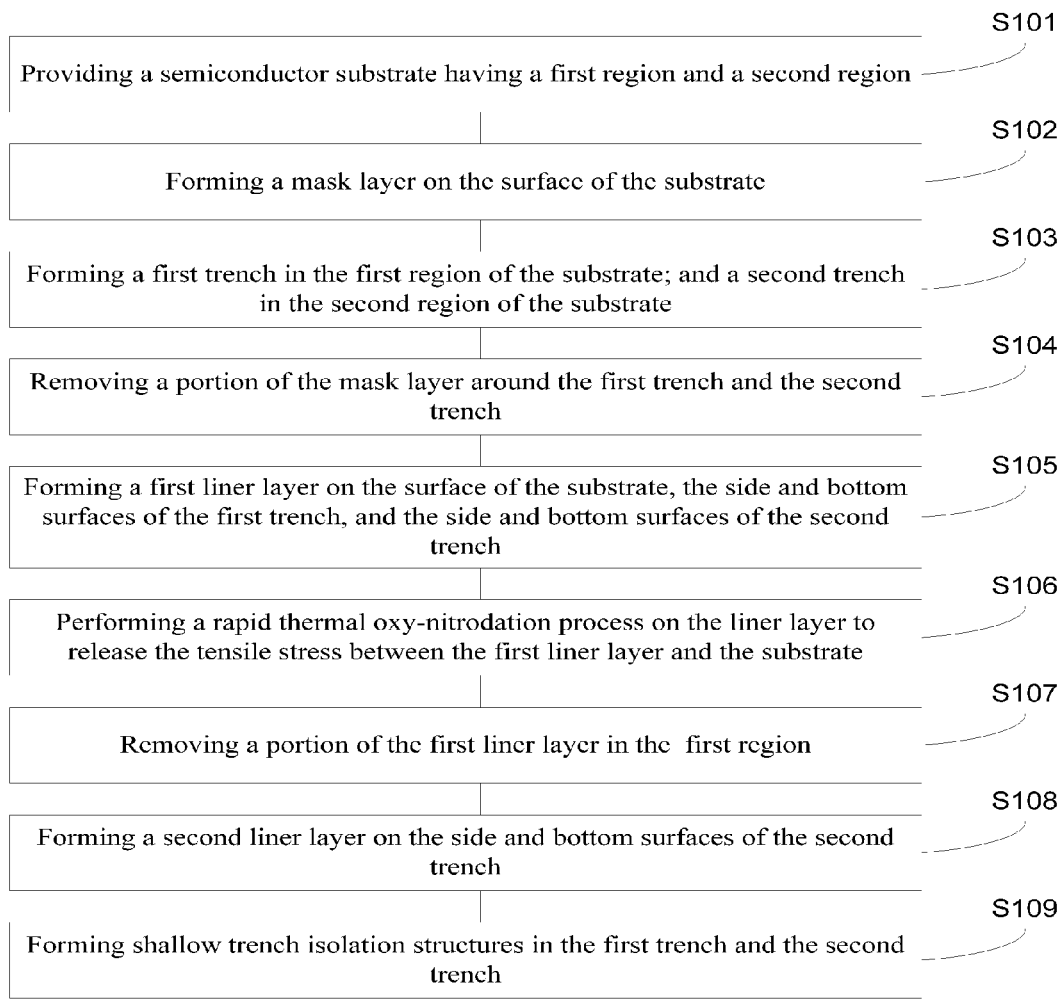
FIG. 14 illustrates an exemplary fabrication process of a semiconductor structure having a plurality of shallow trench isolation structures consistent with the disclosed embodiments.

FIG. 14 illustrates an exemplary fabrication process of a semiconductor structure having a plurality of shallow trench isolation (STI) structures consistent with the disclosed embodiments; and the FIG. 5-13 illustrate semiconductor structures corresponding to certain stages of the exemplary fabrication process.

Figure 5:
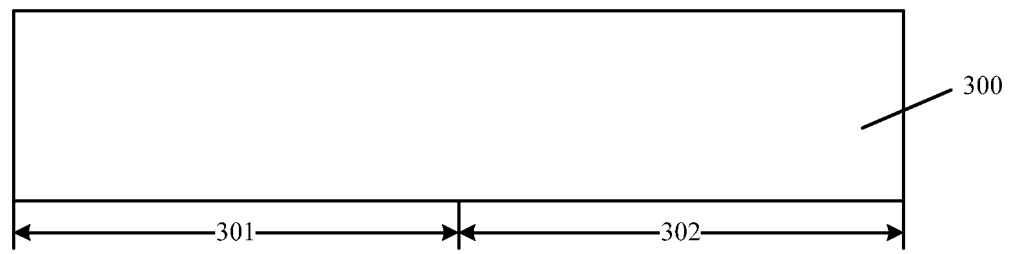
FIGS. 5-13 illustrate semiconductor structures corresponding to certain stages of an exemplary fabrication process of a semiconductor structure having a plurality of shallow trench isolation structures consistent with the disclosed embodiments.

As shown in FIG. 14, at the beginning of fabrication process, a substrate with certain structures is provided (S101). FIG. 5 illustrates a corresponding semiconductor structure.

As shown in FIG. 5, a substrate 300 is provided. The substrate 300 may include any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. In one embodiment, the substrate 300 is a silicon substrate. The substrate 300 provides a base for subsequent devices and processes.

The substrate 300 may have a first region 301 and a second region 302. In one embodiment, the first region 301 may be used to subsequently form NMOS transistors. Thus, P-type well regions (not shown) may be formed in the first region 301 of the substrate 300. The second region 302 may be used to subsequently form PMOS transistors. Thus, N-type well regions (not shown) may be formed in the second region 302 of the substrate 200. The P-type regions and the N-type regions may be formed by any appropriate process, such as an ion implantation process, etc. In certain other embodiments, the first region 301 may be used to subsequently form PMOS transistors; and the second region 302 may be used to subsequently form NMOS transistors.

At least one first trench may be subsequently formed in the first region 301 of the substrate 300; and at least one second trench may be subsequently formed in the second region 302 of the substrate 300. STI structures may be then formed in the first trench and the second trench.

Figure 6:
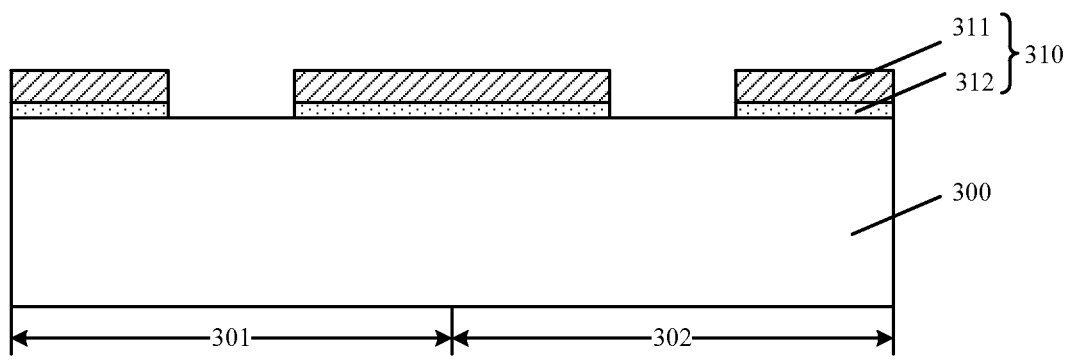

Returning to FIG. 14, after providing the substrate 300, a mask layer 310 may be formed (S102). FIG. 6 illustrates a corresponding semiconductor structure.

As shown in FIG. 6, a mask layer 310 is formed on the surface of the substrate 300. The mask layer 310 may expose a portion the surface of the substrate 300 in the first region 301 and a portion of the surface of the substrate 300 in the second region 302. Further, the mask layer 310 may be a double-layer structure including a first layer 312 formed on the surface of the substrate 300, and a second layer 311 formed on the first layer 312.

The first layer 312 and the second layer 311 may be made of any appropriate material. In one embodiment, the first layer 312 is made of silicon oxide. Thus, the first layer 312 may be referred as a silicon oxide layer 312. The second layer 311 is made of silicon nitride. Thus, the second layer 311 may be referred as a silicon nitride layer 311. The silicon nitride layer 311 may have a significantly high hardness. Thus, it may be able to keep the stability of the patterns during subsequent etching processes. The silicon oxide layer 312 may be used to increase the adhesion force between the silicon nitride layer 311 and the substrate 300, the peeling off of the silicon nitride layer 311 during the subsequent etching processes may be avoided. In certain other embodiments, the mask layer 310 may be a single layer structure made of silicon oxynitride.

A process for forming the mask layer 310 may include forming a silicon oxide film (not labeled) on the surface of the substrate 300; forming a silicon nitride film (not labeled) on the surface of the silicon oxide film; and forming a patterned photoresist layer exposing the corresponding regions of the subsequently formed first trench and second trench on the silicon nitride film; and etching the silicon nitride film and the silicon oxide film using the patterned photoresist layer as an etching mask until the surface of the substrate 300 is exposed. Thus, the mask layer 310 exposing portions of the surface of the substrate 300 may be formed.

In one embodiment, after forming the mask layer 310, the patterned photoresist layer may be removed. In certain other embodiments, the patterned photoresist layer may be kept.

In certain other embodiments, more than one portion of the surface of the substrate 300 in the first region 301 may be exposed; and more than one portion of the surface of the substrate 300 in the second region 302 may be exposed. Therefore, more than one trench may be subsequently formed in the first region 301 of the substrate 300; and more than one trench may be subsequently formed in the second region 302 of the substrate 300.

Various processes may be used to form the silicon oxide film, such as a chemical vapor deposition (CVD) process, a physical vapor deposition (PVD) process, an atomic layer deposition (ALD) process, a thermal oxidation process, a chemical oxidation process, or a flowable CVD (FCVD) process, etc. Various processes may be used to form the silicon nitride film, such as a CVD process, a PVD process, an ALD process, or an FCVD process, etc. The silicon oxide film and the silicon nitride film may be etched by any appropriate process, such as a dry etching process, or a wet etching process, etc.

Figure 7:
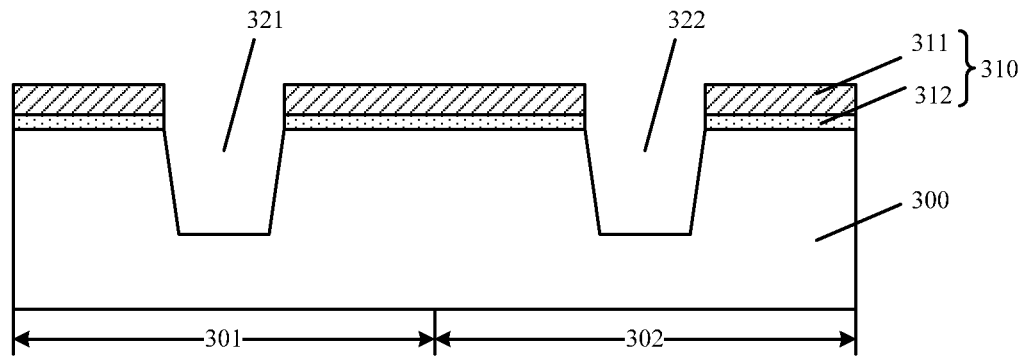

Returning to FIG. 14, after forming the mask layer 310, at least one first trench and at least second trench may be formed (S103). FIG. 7 illustrates a corresponding semiconductor structure.

As shown in FIG. 7, a first trench 321 is formed in the first region 301 of the substrate 300; and a second trench 322 is formed in the second region 302 of the substrate 300. In certain other embodiments, a plurality of first trenches 321 may be formed in the first region 301 of the substrate 300; and a plurality of the second trenches 322 may be formed in the second region 302 of the substrate 300. The first trench 321 may be used to subsequently form a STI structure in the first region 301 of the substrate 300. The second trench 322 may be used to subsequently form a STI structure in the second region 302 of the substrate 300.

The first trench 321 and the second trench 322 may be formed by etching the substrate 300 using the mask layer 310 as an etching mask. The sidewalls of the first trench 321 and the second trench 322 may be perpendicular to the surface of the substrate 300. Or, as shown in FIG. 7, the sidewalls of the first trench 321 and the second trench 322 may incline with surface of the substrate 300. That is, the bottom size of the first trench 321 and the second trench 322 may be smaller than the top size of the first trench 321 and the second trench 321.

In one embodiment, the sidewalls of the first trench 321 and the second trench 322 may incline with the surface of the substrate 300. That is, the bottom size of the first trench 321 and the second trench 322 may be smaller than the top size of the first trench 321 and the second trench 321. The inclining angle of the sidewalls of the first trench 321 and the second trench 322 may be adjusted by the process parameters for forming the first trench 321 and the second trench 322. When the sidewalls of the first trench 321 and the second trench 322 incline with the surface of the substrate 200, the subsequently formed liner layers may have a uniform thickness. Further, the inside of the subsequently formed liner layers may be significantly dense; and it may not be easy to form voids in the subsequently formed shallow trench isolation (STI) structures.

In one embodiment, the height-to-width aspect ratio of the first trench 321 and the second trench 322 may be greater than approximately 5:1. The height-to-width ratio may be relatively large. Thus, it may need to use a high respect ratio process (HARP) to subsequently form STI structures in the first trench 321 and the second trench 322.

The first trench 321 and the second trench 322 may be formed by any appropriate process, such as a dry etching process, or a wet etching process, etc. In one embodiment, an anisotropic dry etching process is used to etch the substrate 300 to form the first trench 321 and the second trench 322.

The etching gas of the anisotropic dry etching process may include one or more of $Cl_2$, and HBr, etc. The flow rate of HBr may be in a range of approximately 200 sccm-800 sccm. The flow rate of $Cl_2$ may be in a range of approximately 20 sccm-100 sccm. The carrier gas may be Ar, etc. The flow rate of Ar may be in a range of approximately 50 sccm-1000 sccm. The pressure of the etching chamber of the anisotropic dry etching process may be in a range of approximately 2 mTorr~200 mTorr. The etching time may be in a range of approximately 15 s~60 s.

In one embodiment, the mask layer 310 may be removed after subsequently forming the STI structures. Thus, the mask layer 310 formed on the substrate 300 may protect the substrate 300 during the subsequent processes for forming the STI structures. In certain other embodiments, the mask layer 310 may be removed after forming the first trench 321 and the second trench 322.

Figure 8:
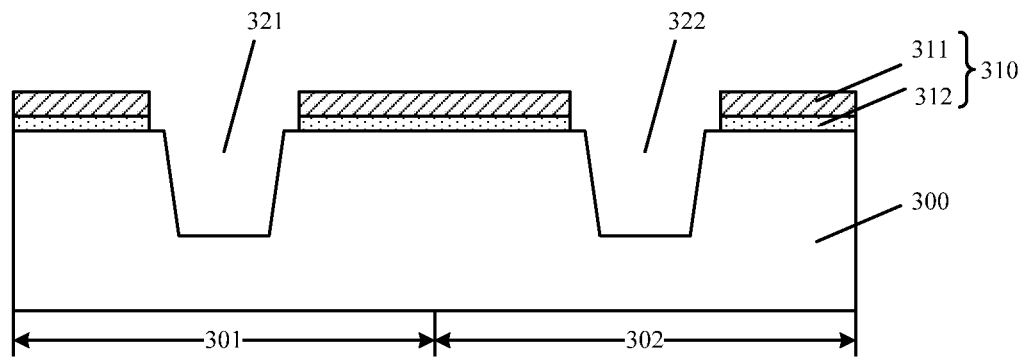

Returning to FIG. 14, after forming the first trench 321 and the second trench 322, a portion of the first mask layer 310 around the first trench 321 and the second trench 322 may be removed (S104). FIG. 8 illustrates a corresponding semiconductor structure.

As shown in FIG. 8, a portion of the mask layer 310 around the first trench 321 and the second trench 322 is removed. A portion of the surface of the substrate 300 around the first trench 321 and the second trench 322 is exposed.

In one embodiment, after forming the first trench 321 and the second trench 322, a pull back process may be performed to expose the portion of the surface of the substrate 300 around the first trench 321 and the second trench 322. A first liner layer and a second liner layer may be subsequently formed. The first liner layer and the second liner layer may be formed by a reaction between a reaction gas and the exposed surface of the substrate 300, the side and bottom surfaces of the first trench 321 and the second trench 322. Because the reaction gas may react with the exposed surface of the substrate 300 and the side and bottom surfaces first trench 321 and the second trench 322 simultaneously, the reaction rate at the apex angles between the exposed surface the substrate 300 and the side surfaces of the first trench 321 and the second trench 322 may be relatively fast. Further, the reaction temperature may be relatively high. Thus, after the reaction, the first liner layer and the second layer at the apex angles may have round corners. The round corners may aid to fill an isolation material into the first trench 321 and the second trench 322. Thus, it may prevent the top of the first trench 321 and the top of the second trench 322 from being closed significantly fast. If the top of the first 321 and the top of the second trench 322 are closed significantly fast, voids may be formed inside the subsequently formed STI structures.

The pull back process may be any appropriate process, such as a dry etching process, or a wet etching process, etc. In one embodiment, the pull back process is an isotropic dry etching process, or an isotropic wet etching process. The isotropic etching process may have relatively high etching rate along every direction. Thus, the isotropic etching process may etch the mask layer 310 along the direction parallel to the surface of the substrate 300 so as to expand the exposed area of the substrate 300. Thus, the portion of the surface of the substrate 300 around the first trench 321 and the second trench 322 may be exposed.

In one embodiment, the isotropic etching process is an isotropic wet etching process. The mask layer 310 may have a silicon oxide layer 312 and a silicon nitride layer 311. Thus, the etching solution of the isotropic wet etching process may include a hydrogen fluoride solution, and a phosphoric acid solution, etc. The ratio of the hydrogen fluoride and the phosphoric solution may be adjusted to adjust the etching rate of the silicon oxide layer 312 and the silicon nitride layer 311.

In certain other embodiments, the isotropic etching process may be an isotropic dry etching process. The etching gas of the isotropic dry etching process may include one or more of $CF_4$, or $CHF_3$, etc. The bias voltage may be smaller than approximately 10 V. The power may be smaller than approximately 100 W. The pressure may be lower than approximately 1 mTorr.

Figure 9:
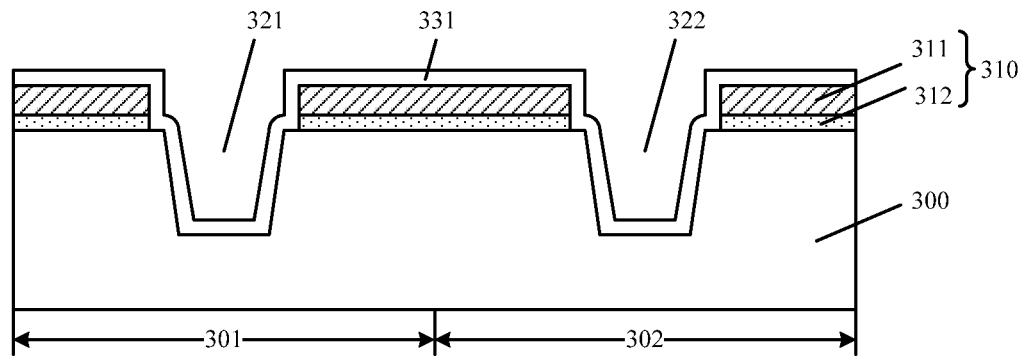

Returning to FIG. 14, after performing the pull back process, a first liner layer may be formed (S105). FIG. 9 illustrates a corresponding semiconductor structure.

As shown in FIG. 9, a first liner layer 331 is formed on the side and bottom surfaces of the first trench 321 and the second trench 322. Further, the first liner layer 331 may also be formed on the surface of the mask layer 310, and the exposed portion of the surface of the substrate 300.

The first liner layer 331 may be used to improve the isolation effect between the substrate 300 and the subsequently formed STI structures. Specifically, the first liner layer 331 may prevent the doping ions in the substrate 300 from diffusing into the STI structures. If the doping ions diffuse into the STI structures, the isolation ability of the STI structures may be reduced.

The first liner layer 331 may be made of any appropriate material, such as silicon oxide, or silicon oxynitride, etc. In one embodiment, the first liner layer 331 is made of silicon oxide.

Various processes may be used to form the first liner layer 331, such as a CVD process, a PVD process, an ALD process, an FCVD process, or a thermal oxidation process, etc. In one embodiment, the first liner layer 331 is formed by an in situ steam generation (ISSG) process. The temperature of the ISSG process may be in a range approximately 700° C.~1200° C. The reaction gas of the ISSG process may include $H_2$, and $O_2$, etc. The flow rate of $H_2$ may be in a range of approximately 1.5 sccm~15 sccm. The flow rate of $O_2$ may be in a range of approximately 1 sccm~30 sccm. The time for forming the first liner layer 331 by the ISSG process may be in a range of approximately 1 min~10 mins.

The reaction gas of the ISSG process may react with the exposed portion of the surface of the substrate 300, the side and bottom surfaces of the first trench 321 and the side and bottom surfaces of the second trench 322 to form the first liner layer 331. The silicon oxide formed by the ISSG process may have a desired cover ability; and may be able to have a significantly tight bonding with the side and bottom surfaces of the first trench 321 and the side and bottom surfaces 322. Further, the thickness of the first liner layer 331 formed by the ISSG process may be uniform; and may have a relatively large density. Therefore, the first liner layer 331 may have a desired isolation performance.

However, the first liner layer 331 and the substrate 300 may have a crystal lattice mismatch. The first liner layer 331 may induce a stress on the substrate 300. In one embodiment, the first liner layer 331 is made of silicon oxide. Thus, the first liner layer 331 may induce a tensile stress on the substrate 300. In one embodiment, the first region 301 may be used to form NMOS transistors; and the second region 302 may be used to form PMOS transistors. The tensile stress induced by the first liner layer 331 in the second region 302 may decrease the carrier mobility of the channel regions of the PMOS transistors formed in the second region 302. Thus, the first liner layer 331 may need to be treated by a subsequent process to release the tensile stress induced by the first liner layer 331.

Figure 10:
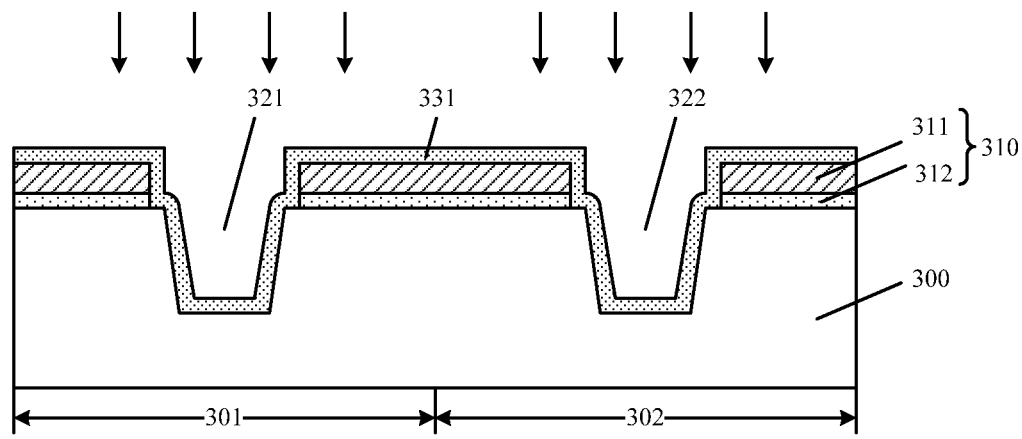

Returning to FIG. 14, after forming the first liner layer 331, the first liner layer 331 may be treated with appropriate processes to release the tensile stress (S106). FIG. 10 illustrates a corresponding semiconductor structure.

As shown in FIG. 10, a rapid thermal oxy-nitridation (RTNO) process is performed on the first liner layer 331 to release the tensile stress between the first liner layer 331 and the substrate 300. The RTNO process may include two steps. The first step may be referred as a rapid thermal nitridation process. The source for the rapid thermal nitridation process may be a nitrogen-contained gas. The flow rate of the nitrogen-contained gas may be in a range of approximately 8 slm~12 slm. The pressure of the source gas may be in a range of approximately 600 Torr~700 Torr. The temperature of the rapid thermal nitridation process may be in a range of approximately 750° C.~850° C. In one embodiment, the nitrogen-contained gas is ammonia gas. The flow rate of the ammonia gas is approximately 10 slm. The temperature is approximately 800° C. After the rapid thermal nitridation process, the material of the first liner layer 331 may be converted to silicon oxynitride.

In the rapid thermal nitridation process, driven by the heat, the nitrogen ions in the nitrogen-contained gas may diffuse into the first liner layer 331. The nitrogen ions diffusing into the first liner layer 331 may disturb the crystal lattice structure of the first liner layer 331; and the crystal lattice constant of the first liner layer 331 may be changed. Thus, the chemical bonds between the first liner layer 331 and the substrate 300 may be changed; and the tensile stress may be released. Further, the first liner layer 331 may be used as a transitional layer such that the subsequently formed STI structures may not generate stress on the substrate 300. Therefore, the first liner layer 331 and the STI structures may not reduce the performance of the subsequently formed PMOS transistors.

Further, the nitrogen ion diffusing into the first liner 331 may also be able to increase the density and the hardness of the first liner layer 331. Thus, the isolation performance of the first liner layer 331 may be improved. The increased density and hardness of the first liner layer may further prevent the doping ions in the first substrate 300 from diffusing into the STI structures.

However, when the rapid thermal nitridation process is performed to release the tensile stress in the first liner layer 331, the tensile stress between the portion of the first liner layer 331 in the first trench 321 in the first region 301 and the substrate 300 may also be released. The first region 301 may be used to subsequently form NMOS transistors. Further, the tensile stress may increase the carrier mobility of the channel regions of the NMOS transistors. Therefore, releasing the tensile stress may decrease the performance of the NMOS transistors formed in the first region 301. Therefore, it may need to subsequently remove the first liner layer 331 in the first region 301; and form a second liner which is able to induce a tensile stress on the substrate 300 in the first region 301.

Further, the second step of the RTNO process may be referred as a rapid thermal oxidation process. After the rapid thermal nitridation process, the first liner layer 331 may be further oxidized. The oxidation gas may be one or more of the $N_2O$, $O_2$, or $H_2O$, etc. The temperature of the rapid thermal oxidation process may be in a range of approximately 1000° C.~1200° C. In one embodiment, the temperature of the rapid thermal oxidation process is approximately 1100° C. The rapid thermal oxidation process may further increase the density of the first liner layer 331. Thus, the isolation performance of the first liner layer 331 may be further improved.

Figure 11:
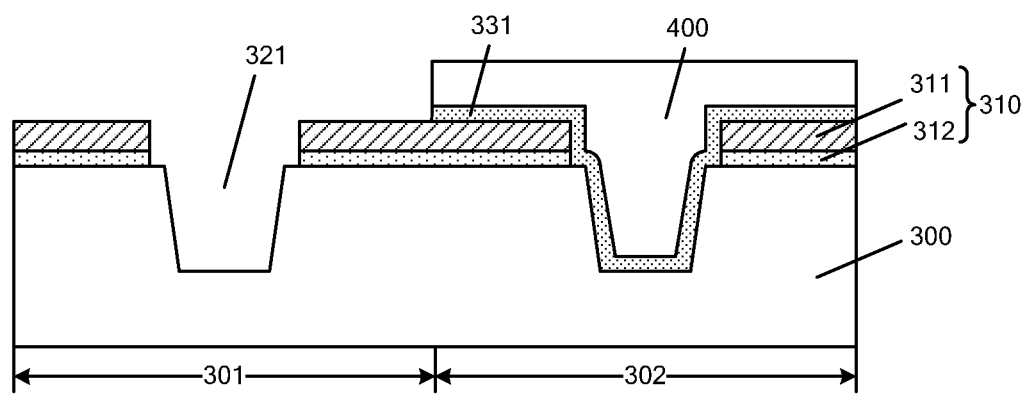

Returning to FIG. 14, after performing the RTNO process, the first liner layer 331 in the first region 301 may be removed (S107). FIG. 11 illustrates a corresponding semiconductor structure.

As shown in FIG. 11, the portion of the first liner layer 331 in the first region 301 is removed. The portion of the first liner layer 331 in the second region 302 may be protected by a patterned photoresist layer 400.

A process for removing the portion of the first liner layer 331 in the first region 301 may include forming a patterned photoresist layer 400 exposing the portion of the first liner layer 331 in the first region 301 on the surface of the first liner layer 331; and followed by etching the first liner layer 331 until the side and bottom surfaces of the first trench 321 are exposed using the patterned photoresist layer 400 as an etching mask. Thus, the portion of the first liner layer 331 in the first region 301 may be removed; and the patterned photoresist layer 400 may be formed on the portion of the first liner layer 331 in the second region 302.

The patterned photoresist layer 400 may be formed by spin-coating a photoresist layer on the first liner layer 331; exposing the photoresist layer by a KrF laser using a mask having the pattern exposing the portion of the first liner layer 331 in the first region 301; and developing the exposing photoresist layer. Thus, the patterned photoresist layer 400 may be formed.

After removing the first liner layer 331 in the first region 301, a second liner layer may be subsequently formed on the side and bottom surfaces of the first trench 321. The second liner layer may apply a tensile stress on the substrate 300 in the first region 301. Thus, the performance of the NMOS transistors subsequently formed on the substrate 300 in the first region 301 may be improved.

The portion of the first liner layer 331 in the first region 301 may be removed by any appropriate process, such as a dry etching process, or a wet etching process, etc. In one embodiment, a wet etching process is used to remove the portion of the first liner layer 331 in the first region 301. The etching solution of the wet etching process may include HF, and SPM cleaning solution, etc. The SPM cleaning solution may include $H_2SO_4$, $H_2O_2$, and $H_2O$, etc. HF may be used to remove silicon oxide. The SPM solution may be used to remove silicon nitride, and the etching by-products left on the side and bottom surfaces of the first trench 321. The wet etching process may have a relatively high etching selectivity. When the first liner layer 331 in the first region 301 is removed, the wet etching process may generate a significantly small damage on the side and bottom surfaces of the first trench 321. Thus, the size of the first trench 321 may not be changed; and the subsequently formed second liner layer may have a desired morphology.

Returning to FIG. 14, after removing the portion of the first liner layer 331 in the first region 301, a second liner layer may be formed (S108). FIG. 12 illustrates a corresponding semiconductor structure.

As shown in FIG. 12, a second liner layer 332 is formed on the side and bottom surfaces of the first trench 321. Further, the patterned photoresist layer 400 may be removed.

The second liner layer 332 may be used to improve the isolation performance between the subsequently formed STI structure in the first trench 321 and the substrate 300. Specifically, the second liner layer 332 may prevent the doping ions in the substrate 300 from diffusing into the STI structure subsequently formed in the first trench 331. Thus, the isolation performance of the STI structure may be ensured.

The second liner layer 332 may be made of any appropriate material. In one embodiment, the second liner layer 332 is made of silicon oxide.

Various processes may be used to form the second liner layer 332, such as a CVD process, a PVD process, an FCVD process, or a thermal oxidation process, etc. In one embodiment, the second oxide layer 332 is formed by a rapid thermal oxidation (RTO) process, or an ISSG process.

In one embodiment, the second liner layer 332 is formed by an ISSG process. The temperature of the ISSG process may be in a range of approximately 700° C.~1200° C. The reaction gas may include $H_2$, and $O_2$, etc. The flow rate of $O_2$ may be in a range of approximately 1 sccm~30 sccm. The flow rate of $H_2$ may be in a range of approximately 1.5 sccm~15 sccm. The reaction time may be in a range of approximately 1 min~10 mins.

The reaction gas of the ISSG process may react with the exposed portion of the surface of the substrate 300, and the side and bottom surfaces of the first trench 331. Thus, the second liner layer 332 may be formed. The silicon oxide layer formed by the ISSG may have a desired surface coverage ability. Thus, the second liner layer 332 and the side and bottom surfaces of the first trench 321 may have significantly strong bonding. Further, the second liner layer 332 may have a uniform thickness, and a relatively large density. Thus, the second liner layer 332 may have a desired isolation performance.

Further, the second liner layer 332 and the substrate 300 may have a crystal lattice mismatch; and the second liner layer 332 may be made of silicon oxide. Thus, the second liner layer 332 may be able to apply a tensile stress on the substrate 300 in the first region 301. The first region 301 of the substrate 300 may be used to subsequently form NMOS transistors. The tensile stress in the substrate 300 may increase the carrier mobility of the channel regions of the NMOS transistors. Thus, the performance of the NMOS transistors formed in the first region 301 of the substrate 300 may be enhanced.

In one embodiment, the patterned photoresist layer 400 formed on the second region 302 may be removed after forming the second liner layer 332. In certain other embodiments, the patterned photoresist layer 400 may be removed before forming the second liner layer 332.

Returning to FIG. 14, after forming the second liner layer 332, STI structures may be formed (S109). FIG. 13 illustrates a semiconductor structure.

As shown in FIG. 13, STI structures 340 are formed in the first trench 321 and the second trench 322. That is, the STI structures 340 fill the first trench 321 and the second trench 332.

A process for forming the STI structures 340 may include forming an insolation film on the surface of the mask layer 310, the surface of the first liner layer 331 and the second liner layer 332 to fill the first trench 321 and the second trench 322; and followed by performing a planarization process until the surface of the substrate 300 is exposed. Thus, one first STI structure 340 is formed in the first trench 321; and another STI structure 340 is formed in the second trench 322.

The isolation film may be made of any appropriate material, such silicon oxide, silicon nitride, or silicon oxynitride, etc. In one embodiment, the isolation film is made of silicon oxide.

Various processes may be used to form the isolation film, such as a CVD process, a PVD process, an FCVD process, or a thermal oxidation process, etc. In one embodiment, the height-to-width aspect ratio of the first trench 321 and the second trench 322 may be relatively large. Thus, a high aspect ratio process (HARP) may be used to form the isolation film. The HARP is also a CVD process. The reaction gas of the HARP may include $Si(OC_2H_5)_4$, and $O_3$, etc. The flow rate of $Si(OC_2H_5)_4$ may be in a range of approximately 500 mg/min~8000 mg/min. The flow rate of the $O_3$ may be in a range of approximately 5000 mg/min~30000 mg/min. The pressure of the HARP may be in a range of approximately 300 Torr~600 Torr. The temperature of the HARP may be in a range of approximately 400° C.~600° C. Further, the reaction gas may also include $N_2$, $O_2$, and He, etc. The flow rate of $N_2$ may be in a range of approximately 1000 sccm~10000 sccm. The flow rate of $O_2$ may be in a range of approximately 0~5000 sccm. The flow rate of He may be in a range of approximately 5000 sccm~20000 sccm.

The planarization process may be any appropriate process, such as a chemical mechanical polishing process, or a physical mechanical polishing process, etc. In one embodiment, a chemical mechanical polishing process is used to planarize the isolation film to form the STI structures 340. Referring to FIG. 12, the mask layer 310 may be used as a polishing stop layer. After exposing the surface of the mask layer 310, the chemical mechanical polishing process may continue to polish the mask layer 310 until the surface of the substrate 300 is exposed. Thus, the STI structures 340 may be formed.

Thus, a semiconductor structure may be formed by the above disclosed processes and methods; and the corresponding semiconductor structure is illustrated in FIG. 13. As shown in FIG. 13, the semiconductor structure include a substrate 200 having a first region 301 and a second region 302. The semiconductor structure also includes shallow trench isolation structures 340 formed in the substrate 200 in both the first region 301 and the second region 302. Further, the semiconductor structure include a first liner layer 331 doped with nitrogen ions to release a tensile stress between the first liner layer 331 and the substrate 300 formed between the shallow trench isolation structure 340 and the substrate 300 in the second region 302. Further, the semiconductor structure also include a second liner layer 332 formed between the shallow trench isolation structure 340 and the substrate 300 in the first region 301. The detailed structures and intermediate structures are described above with respect to the fabrication processes.

According to the disclosed methods and structures, the substrate may have a first region and a second region used for forming different types of semiconductor devices, respectively. A first trench may be formed in the first region; and a second trench may be formed in the second region. After forming a first liner layer on the side and bottom surfaces of the first trench and the second trench, the first liner layer may be doped with nitrogen ions to release the tensile stress between the first liner layer and the substrate. Thus, it may avoid affecting the performance of the PMOS devices subsequently formed in the second region. Further, the doped nitrogen ions in the first liner layer may be able to increase the isolation performance of the first liner layer. Thus, it may prevent the doping ions in the substrate from diffusing into the STI structure subsequently formed in the second trench.

Further, after removing a portion of the first liner layer in the first region, a second liner layer may be formed on the top and side surfaces of the first trench. The second liner layer may be able to apply a tensile stress on the substrate in the first region. The tensile stress may be able to improve the performance of the devices subsequently formed in the first region. Further, the second liner layer may also be able to prevent the doping ions in the substrate from diffusing into the shallow trench isolation structure subsequently formed in the first trench. Therefore, by forming different liner layers in the first region and the second region respectively, the performances of the devices formed in the first region and the second region may be both improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a substrate having a first region and a second region;
   forming at least one first trench in the first region of the substrate, and at least one second trench in second region of the substrate;
   forming a first liner layer on side and bottom surfaces of the first trench, and the side and bottom surfaces of the second trench;
   performing a rapid thermal oxy-nitridation process on the first liner layer releasing a tensile stress between the first liner layer and the substrate;
   removing a portion of the first liner layer in the first region exposing the first trench;
   forming a second liner layer on the side and bottom surfaces of the first trench, the second liner layer being made of a material different than that of the first liner layer, and tensile stress between the second liner layer and the substrate being more than that between the first liner layer and the substrate;
   forming an isolation film on the first liner layer and the second liner layer; and
   performing a planarization process on the isolation film until the substrate is exposed, thus forming shallow trench isolation structures in the first trench and the second trench.

2. The method according to claim 1, wherein:
   the first liner layer is made of silicon oxide before the rapid thermal oxy-nitridation process; and
   the first liner layer is transformed to silicon oxynitride after the rapid thermal oxy-nitridation process.

3. The method according to claim 1, wherein:
   the first liner layer is formed by an in situ steam generation (ISSG) process.

4. The method according to claim 1, wherein:
   the second liner layer is made of silicon oxide.

5. The method according to claim 1, wherein:
   the rapid thermal oxy-nitridation process includes a rapid thermal nitridation process and a rapid thermal oxidation process.

6. The method according to claim 5, wherein:
   a source gas of the rapid thermal nitridation process is a nitrogen-contained gas;

a flow rate of the nitrogen-contained gas is in a range of 8 slm-12 slm;

a pressure of the rapid thermal nitridation process is in a range of 600 Torr-700 Torr; and a temperature of the rapid thermal nitridation process is in a range of 750° C.-850° C.

7. The method according to claim 5, wherein:

a source gas of the rapid thermal oxidation process includes one or more of $N_2O$, $O_2$, and $H_2O$; and a temperature of the rapid thermal oxidation process is in a range of 1000° C.-1200° C.

8. The method according to claim 1, wherein:

the portion of the first liner layer in the first region is removed by a wet etching process.

9. The method according to claim 8, wherein:

an etching solution of the wet etching process includes HF, $H_2SO_4$, $H_2O_2$ and $H_2O$.

10. The method according to claim 1, wherein forming a first trench and a second trench further includes:

forming a mask layer exposing portions of the surface of the substrate in the first region and the second region; and etching the substrate using the mask layer as an etching mask.

11. The method according to claim 10, after forming the first trench and the second trench, further including:

performing a pull back process to expose a portion of the surface of the substrate around the first trench and the second trench.

12. The method according to claim 10, wherein:

the mask layer is a single layer structure made of silicon nitride.

13. The method according to claim 10, wherein:

the mask layer include a silicon oxide layer formed on the surface of the substrate; and a silicon nitride layer formed on the silicon oxide layer.

14. The method according to claim 1, wherein:

NMOS transistors are formed in the first region of the substrate; and

PMOS transistors are formed in the second region of the substrate.

* * * * *